(12) United States Patent
Miller et al.

(10) Patent No.: US 11,804,695 B2
(45) Date of Patent: Oct. 31, 2023

(54) INTEGRATED FLOOD AND SPOT ILLUMINATORS

(71) Applicant: Lumentum Operations LLC, San Jose, CA (US)

(72) Inventors: John Michael Miller, Ottawa (CA); Lijun Zhu, Dublin, CA (US); Huanlin Zhu, San Jose, CA (US); Benjamin Kesler, Sunnyvale, CA (US); Ajit Vijay Barve, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 362 days.

(21) Appl. No.: 17/247,660

(22) Filed: Dec. 18, 2020

(65) Prior Publication Data

US 2022/0085572 A1  Mar. 17, 2022

Related U.S. Application Data

(60) Provisional application No. 62/706,816, filed on Sep. 11, 2020.

(51) Int. Cl.
*H01S 5/183* (2006.01)
*F21S 8/00* (2006.01)
*F21Y 115/30* (2016.01)

(52) U.S. Cl.
CPC .......... *H01S 5/18302* (2013.01); *F21S 8/003* (2013.01); *F21Y 2115/30* (2016.08)

(58) Field of Classification Search
CPC .... H01S 5/4012; H01S 5/4075; H01S 5/4081; H01S 5/42–423; H01S 5/0225–02257; G02B 27/0955; G02B 27/10; G01N 15/02; G01N 15/0205; G01N 15/1434; G01N 2015/1438; G01N 2015/144; G01S 17/10; G01S 17/894; G01S 17/4865
See application file for complete search history.

(56) References Cited

U.S. PATENT DOCUMENTS

| | | | | |
|---|---|---|---|---|
| 5,619,488 A | * | 4/1997 | Ota | B41J 2/473 |
| 8,248,700 B1 | * | 8/2012 | Zorabedian | G02B 27/46 |
| | | | | 359/618 |
| 11,036,291 B1 | * | 6/2021 | Zhang | H04N 23/56 |
| 2016/0178915 A1 | * | 6/2016 | Mor | G06F 3/0304 |
| | | | | 359/566 |
| 2020/0251882 A1 | * | 8/2020 | Lyon | H01S 5/021 |
| 2022/0066036 A1 | * | 3/2022 | Shi | G01S 7/4813 |

* cited by examiner

*Primary Examiner* — Tod T Van Roy
*Assistant Examiner* — Delma R Fordé
(74) *Attorney, Agent, or Firm* — Harrity & Harrity, LLP

(57) ABSTRACT

In some implementations, an emitter module may include an emitter layer including a first emitter array configured to produce a first beam that provides flood illumination, and a second emitter array configured to produce a second beam that provides spot illumination. The emitter module may include a first optics layer, positioned in front of the emitter layer, that includes a first collimating lens positioned in front of the first emitter array, and a second collimating lens positioned in front of the second emitter array. The emitter module may include a second optics layer, positioned in front of the first optics layer, that includes an optical diffuser positioned in front of the first collimating lens, and a beamsplitter grating positioned in front of the second collimating lens.

20 Claims, 5 Drawing Sheets

INTEGRATED FLOOD AND SPOT ILLUMINATORS

CROSS-REFERENCE TO RELATED APPLICATION

This patent application claims priority to U.S. Provisional Patent Application No. 62/706,816, filed on Sep. 11, 2020, and entitled "COMPACT FLOOD AND SPOT PROJECTOR OPTICS." The disclosure of the prior application is considered part of and is incorporated by reference into this patent application.

TECHNICAL FIELD

The present disclosure relates generally to three-dimensional (3D) sensing and to integrated flood and spot illuminators.

BACKGROUND

A vertical-emitting device, such as a vertical cavity surface emitting laser (VCSEL), may include a laser and/or an optical transmitter, among other examples, in which a beam is emitted in a direction perpendicular to a surface of a substrate (e.g., vertically from a surface of a semiconductor wafer). Multiple vertical-emitting devices may be arranged in one or more emitter arrays (e.g., VCSEL arrays) on a common substrate.

SUMMARY

In some implementations, a VCSEL module includes a VCSEL layer, including a substrate, a first VCSEL array disposed on the substrate and configured to produce a first beam that provides flood illumination, and a second VCSEL array disposed on the substrate and configured to produce a second beam that provides spot illumination; a first optics layer, positioned in front of the VCSEL layer, including a first collimating lens positioned in front of the first VCSEL array, and a second collimating lens positioned in front of the second VCSEL array; and a second optics layer, positioned in front of the first optics layer, including an optical diffuser positioned in front of the first collimating lens, and a beamsplitter grating positioned in front of the second collimating lens, where the first beam and the second beam are to have a combined size, at an about 1 millimeter distance in front of the second optics layer, that is less than a sum of respective sizes of the first beam and the second beam at the about 1 millimeter distance in front of the second optics layer.

In some implementations, an emitter module includes an emitter layer, including a first emitter array configured to produce a first beam that provides flood illumination, and a second emitter array configured to produce a second beam that provides spot illumination; a first optics layer, positioned in front of the emitter layer, including a first collimating lens positioned in front of the first emitter array, and a second collimating lens positioned in front of the second emitter array; and a second optics layer, positioned in front of the first optics layer, including an optical diffuser positioned in front of the first collimating lens, and a beamsplitter grating positioned in front of the second collimating lens.

In some implementations, a sensing device includes a housing; an aperture in the housing; and an emitter module within the housing, including: an emitter layer, including a first emitter array configured to produce a first beam that provides flood illumination, and a second emitter array configured to produce a second beam that provides spot illumination; a first optics layer, positioned in front of the emitter layer, including a first collimating lens positioned in front of the first emitter array, and a second collimating lens positioned in front of the second emitter array; and a second optics layer, positioned in front of the first optics layer, including an optical diffuser positioned in front of the first collimating lens, and a beamsplitter grating positioned in front of the second collimating lens.

DETAILED DESCRIPTION

Figure 1:
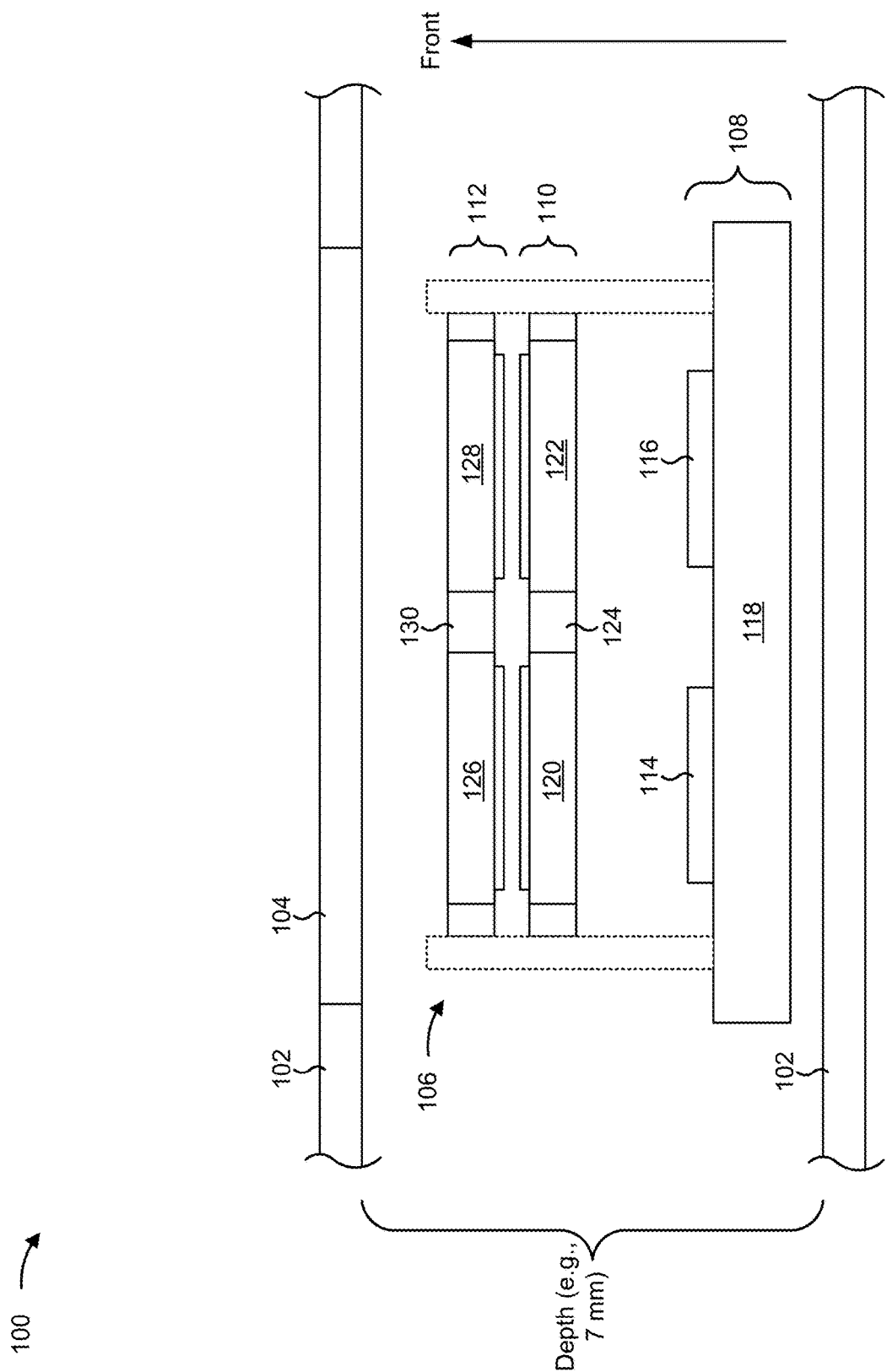
FIG. 1 is a diagram of a cross-sectional view of an example sensing device described herein.

The following detailed description of example implementations refers to the accompanying drawings. The same reference numbers in different drawings may identify the same or similar elements.

An indirect time-of-flight (TOF) sensor with a flood illuminator may be used for 3D sensing, such as in mobile applications (e.g., for distance sensing or gesture recognition, among other examples). However, a sensing distance may be limited by an optical power of the flood illuminator and a sensitivity of a TOF sensor. To extend the sensing distance, a spot TOF sensor with a spot (e.g., dot) illuminator may be used. This may achieve a longer sensing distance, but may result in lower resolution. A device may combine indirect TOF procedures and spot TOF procedures to obtain high-resolution at close distance and a capability to sense long distance with lower resolution. For example, the device may include two structured-light illuminators (e.g., a flood illuminator and a spot illuminator for indirect TOF and spot TOF, respectively) to perform both indirect TOF and spot TOF procedures.

Some techniques for including the two illuminators may result in excessive form factor, which may prevent miniaturization and inclusion in, for example, mobile phones. For example, a device may use switchable optics (e.g., a single VCSEL with a collimating lens, a diffractive optical element (DOE), and liquid crystal (LC) switchable optics to enable switching between flood and spot illumination from the single VCSEL). However, a dedicated driver for the LC switchable optics may result in excessive size for the resultant module, which may be incompatible with inclusion in devices with limited space for components to perform distance sensing.

Some implementations described herein provide a small form factor emitter module for distance sensing. For example, some implementations may provide optics that can project a flood pattern and/or a spot pattern. In some implementations, the optics may achieve a combined flood-spot beam size of less than, for example, 4.5 millimeters (mm) (e.g., which may correspond to an available size of an aperture diameter of a mobile phone) at approximately 1.0 mm above the emitter module (e.g., a mobile phone aperture position) with maximum optical power in the flood beam and with no optical crosstalk between flood optics and spot optics.

Some implementations described herein provide an optical configuration for a VCSEL-based flood and spot array projector, such that the flood and spot projector optics are disposed in relatively close proximity to each other (e.g., using a two-segment configuration that includes a flood projector segment and a spot projector segment) in the same compact sized optical module for TOF 3D sensing applications. Based on the optics having a relatively small form-factor, an opto-mechanical module that includes the optics may be manufactured with a relatively small form-factor, thereby enabling inclusion into the housing of, for example, a mobile phone, a smartphone, or a tablet-type device, among other examples.

FIG. 1 is a diagram of a cross-sectional view of an example sensing device 100 described herein. The sensing device 100 may correspond to a mobile phone, a smartphone, or a tablet-type device, among other examples. Thus, the sensing device 100 may have a depth between 5 mm to 10 mm, such as a depth of about 7 mm. As shown in FIG. 1, the sensing device 100 includes a housing 102, for example, for containing internal circuitry, electrical components, and/or optical components, among other examples, of the sensing device 100. In some examples, the housing includes a grounded shielding for reducing electromagnetic interference radiation. An aperture 104 may be in the housing 102 to define a window for projecting light through the housing 102. The aperture 104 may be circular. In some implementations, the aperture 104 has a diameter of about (e.g., ±10%) 6.0 mm, about 5.5 mm, about 5.0 mm, about 4.5 mm, or about 4.0 mm.

As shown in FIG. 1, the housing 102 may contain an emitter module 106 (e.g., that emits light in a direction corresponding to the arrow labeled "Front"). For example, the emitter module 106 may be a VCSEL module. The emitter module 106 may include a first lateral side configured to produce flood illumination and a second lateral side configured to produce spot illumination, as described below. The emitter module 106 may include an emitter layer 108, a first optics layer 110 positioned in front of (e.g., in the emission direction of the emitter module 106) the emitter layer 108, and a second optics layer 112 positioned in front of the first optics layer 110. In other words, the first optics layer 110 may be between the emitter layer 108 and the second optics layer 112. As shown, the emitter module 106 may be disposed in the housing 102 such that the second optics layer 112 is nearest to the aperture 104 and the emitter layer 108 is furthest from the aperture 104. The emitter layer 108, the first optics layer 110, the second optics layer 112, and the aperture 104 may be in vertical alignment, such that light beams emitted from the emitter layer 108 pass through the first optics layer 110, then the second optics layer 112, and then the aperture 104.

The first optics layer 110 and/or the second optics layer 112 may have a thickness from (e.g., between and including) 0.2 mm to 0.6 mm, such as a thickness from 0.4 mm to 0.6 mm or a thickness of about 0.3 mm or about 0.5 mm. The emitter layer 108 and the first optics layer 110 may be separated (e.g., measured from a top surface of emitter arrays of the emitter layer 108) by a distance from 0.2 mm to 2.0 mm, such as a distance from 1.4 mm to 1.5 mm or a distance of about 1.24 mm or about 1.45 mm. The first optics layer 110 and the second optics layer 112 may be separated by a distance from 0.01 mm to 0.5 mm, such as a distance from 0.25 mm to 0.35 mm or a distance of about 0.3 mm. The second optics layer 112 and the aperture 104 may be separated (e.g., between a top surface of the second optics layer 112 and a bottom surface of the aperture 104) by a distance that is less than or equal to 1.0 mm, such as a distance of about 0.91 mm.

In some implementations, the emitter layer 108 and the first optics layer 110, and/or the first optics layer 110 and the second optics layer 112, may be separated by a medium. For example, the medium may be an air medium. As another example, the medium may have a refractive index from 1.4 to 1.6, such as a refractive index of about 1.5. In some examples, the first optics layer 110 and the second optics layer 112 may be separated by an epoxy medium or a polymer medium, among other examples.

In some examples, the emitter layer 108, the first optics layer 110, and/or the second optics layer 112 may include anti-reflection coatings. Additionally, or alternatively, the first optics layer 110 and/or the second optics layer 112 may include one or more indium-tin-oxide surface regions.

The emitter layer 108 is a planar element that includes a plurality of emitter arrays. For example, the emitter layer 108 may include a first emitter array 114 and a second emitter array 116. The first emitter array 114 and/or the second emitter array 116 may be top-emitting emitter arrays (e.g., with no top side n-contact). The first emitter array 114 and/or the second emitter array 116 may be VCSEL arrays. An emitter array (e.g., a VCSEL array) may include a plurality of emitters (e.g., a plurality of VCSELs). The first emitter array 114 may be configured to produce a first beam (e.g., a light emission of the plurality of emitters of the first emitter array 114) that provides flood illumination (e.g., diffuse light). That is, the first emitter array 114 may be a flood projector (e.g., a flood VCSEL) that produces a flood beam (e.g., light in a flood pattern). Accordingly, the first emitter array 114 may be referred to herein as a flood emitter array. The second emitter array 116 may be configured to produce a second beam (e.g., a light emission of the plurality of emitters of the second emitter array 116) that provides spot illumination (e.g., distributed light). That is, the second emitter array 116 may be a spot (or dot) projector (e.g., a spot VCSEL) that produces a spot beam (e.g., light in a spot pattern). Accordingly, the second emitter array 116 may be referred to herein as a spot emitter array. Beams of the flood emitter array 114 and the spot emitter array 116 may be associated with a beam divergence of 20 to 25 degrees, such as a beam divergence of 23 degrees.

The flood emitter array 114 and the spot emitter array 116 may be in relatively close proximity to each other. For example, a center of the flood emitter array 114 and a center of the spot emitter array 116 may be separated by a distance from 1.3 mm to 1.4 mm, such as a distance of about 1.36 mm. A center of an emitter array may be a central point of an emitter active area of the emitter array or a central point of a chip that includes the emitter array. The flood emitter array 114 and the spot emitter array 116 may be fabricated on respective dies, each having a die size of about 2.4 mm by 3.6 mm.

In some implementations, the emitter layer 108 may include a substrate 118. For example, the substrate 118 may include a high-temperature co-fired ceramic substrate, such as an alumina ($Al_2O_3$) ceramic substrate. The substrate 118 may have a thickness from 0.8 mm to 0.9 mm, such as a thickness of about 0.85 mm. The flood emitter array 114 and the spot emitter array 116 may be disposed on the substrate 118. In other words, the flood emitter array 114 and the spot emitter array 116 may share a common surface, such that the flood emitter array 114 and the spot emitter array 116 are co-planar (e.g., the flood emitter array 114 and the spot emitter array 116 are side-by-side on the common surface).

In some implementations, a distance between a surface (e.g., an upward surface) of the flood emitter array 114 and a surface (e.g., a downward surface) of the first optics layer 110 is different than (e.g., less than) a distance between a surface (e.g., an upward surface) of the spot emitter array 116 and the surface of the first optics layer 110. For example, the flood emitter array 114 may be disposed on a submount that is disposed on the substrate 118. As another example, a platform may project from the substrate 118 (e.g., toward the first optics layer 110), and the flood emitter array 114 may be disposed on the platform. Additionally, or alternatively, a cavity may be recessed into the substrate 118, and the spot emitter array 116 may be disposed in the cavity.

The first optics layer 110 is a planar element that includes a plurality of lenses. For example, the first optics layer 110 may include a first collimating lens 120 for the flood emitter array 114 and a second collimating lens 122 for the spot emitter array 116. Accordingly, the first collimating lens 120 may be referred to herein as a flood collimating lens, and the second collimating lens 122 may be referred to herein as a spot collimating lens.

The flood collimating lens 120 may be positioned in front of the flood emitter array 114, and the spot collimating lens 122 may be positioned in front of the spot emitter array 116. Accordingly, the flood emitter array 114 and the flood collimating lens 120 may be in vertical alignment, such that a beam of the flood emitter array 114 passes through the flood collimating lens 120. The spot emitter array 116 and the spot collimating lens 122 may be in vertical alignment, such that a beam of the spot emitter array 116 passes through the spot collimating lens 122. There may be no optical crosstalk between the flood collimating lens 120 and the spot collimating lens 122.

In some implementations, an effective focal length of the flood collimating lens 120 and an effective focal length of the spot collimating lens 122 may be the same or may be different. For example, an effective focal length of the flood collimating lens 120 may be longer than an effective focal length of the spot collimating lens 122. Thus, an amount of separation between the flood emitter array 114 and the flood collimating lens 120 may be less than the effective focal length of the flood collimating lens 120. The spot collimating lens 122 may be associated with an optical magnification of about 300. Each of the collimating lenses 120, 122 may be associated with an f-number (or focal ratio, which is the ratio of a lens's focal length to entrance pupil diameter) from about 0.9 to 2.0, such as an f-number from 0.9 to 1.1 or an f-number of about 1. In this way, a thickness of the first optics layer 110 is minimal, so as to provide a low profile for the emitter module 106.

The collimating lenses 120, 122 may be composed of a polymer (e.g., plastic) or glass, or a glass layer and a polymer layer (e.g., to replicate a diffractive or Fresnel structure). In some implementations, a collimating lens may be a diffractive lens or a Fresnel lens. For example, a collimating lens may include one or more (e.g., two) diffractive surfaces. In some implementations, a collimating lens may be a refractive lens (e.g., which may enable the emitter layer 108 and the first optics layer 110 to be separated by a distance of less than 0.5 mm). For example, a collimating lens may include one or more (e.g., two) refractive surfaces (e.g., two convex refractive surfaces to provide beam size reduction). In some implementations, the flood collimating lens 120 may be a refractive lens and a leading surface (e.g., a surface closer to the flood emitter array 114) of the refractive lens may be flat (e.g., to increase an effective focal length of the refractive lens, for example, for use with a diffractive optical diffuser, as described below).

In some implementations, the first optics layer 110 may include a substrate 124. For example, the substrate 124 may include a glass substrate. The flood collimating lens 120 and the spot collimating lens 122 may be disposed on the substrate 124. For example, the flood collimating lens 120 and the spot collimating lens 122 may be respective segments (e.g., respective lenses) of a diffractive lens or a Fresnel lens that are disposed on, patterned on, or included in, a single substrate 124. In some implementations, the flood collimating lens 120 is a first segment of the first optics layer 110, the spot collimating lens 122 is a second segment of the first optics layer 110, and the first segment and the second segment are adjoined to define the first optics layer 110. For example, the flood collimating lens 120 and the spot collimating lens 122 may be respective segments (e.g., respective lenses) of a refractive lens (e.g., a refractive glass or plastic lens) that are fabricated (e.g., molded) into a single component that defines the first optics layer 110. In this way, the first optics layer 110 has a compact footprint to facilitate miniaturization of the emitter module 106. In some implementations, the respective segments of the first optics layer 110 may employ graded-index (GRIN) type lenses (e.g., with planar substrate interfaces) that are used in combination with a surface relief diffractive optical element.

The second optics layer 112 is a planar element that includes a plurality of optical components. For example, the second optics layer 112 may include an optical diffuser 126 for the flood emitter array 114 and a beamsplitter grating 128 for the spot emitter array 116.

The optical diffuser 126 may be positioned in front of the flood collimating lens 120 (which is positioned in front of the flood emitter array 114), and the beamsplitter grating 128 may be positioned in front of the spot collimating lens 122 (which is positioned in front of the spot emitter array 116). Accordingly, the flood emitter array 114, the flood collimating lens 120, and the optical diffuser 126 may be in vertical alignment, such that a beam of the flood emitter array 114 passes through the flood collimating lens 120 and then the optical diffuser 126, thereby producing flood illumination. In particular, an optical center of the flood emitter array 114 (e.g., a mean center of the coordinates of the emitters of the flood emitter array 114, which may be offset from the geometric center of the flood emitter array 114) is vertically aligned with an optical center of the flood collimating lens 120. The spot emitter array 116, the spot collimating lens 122, and the beamsplitter grating 128 may be in vertical alignment, such that a beam of the spot emitter array 116 passes through the spot collimating lens 122 and then the beamsplitter grating 128, thereby producing spot illumination. In particular, an optical center of the spot emitter array 116 (e.g., a mean center of the coordinates of the emitters of the spot emitter array 116, which may be the same as the geometric center of the spot emitter array 116) is vertically aligned with an optical center of the spot collimating lens 122. There may be no optical crosstalk between the optical diffuser 126 and the beamsplitter grating 128.

In some implementations, the optical diffuser 126 may be a refractive diffuser or a diffractive diffuser. For example, the optical diffuser 126 may be a refractive micro-lens array. As another example, the optical diffuser 126 may be a diffractive optical element. In some implementations, the beamsplitter grating 128 may be a diffractive optical element. For example, the beamsplitter grating 128 may be a tiling fan-out diffractive optical element (e.g., a fan-out beamsplitter grating). As another example, the beamsplitter grating 128 may be a three-by-three diffractive optical element (e.g., which in conjunction with the spot emitter array 116 and the spot collimating lens 122 may produce a three-by-three image of the emitters of the spot emitter array 116 at an observation screen or distance).

In some implementations, the second optics layer 112 may include a substrate 130. For example, the substrate 130 may include a glass substrate. The optical diffuser 126 and the beamsplitter grating 128 may be disposed on the substrate 130. For example, the optical diffuser 126 and the beamsplitter grating 128 may be separate components that are disposed on, patterned on, or included in, a single substrate 130. In some implementations, the optical diffuser 126 is a first segment (e.g., the optical diffuser 126 is on a first substrate) of the second optics layer 112, the beamsplitter grating 128 is a second segment (e.g., the beamsplitter grating 128 is on a second substrate) of the second optics layer 112, and the first segment and the second segment are adjoined to define the second optics layer 112. In this way, the second optics layer 112 has a compact footprint to facilitate miniaturization of the emitter module 106. For example, a total optics footprint of the emitter module 106 (e.g., including the emitter arrays 114, 116, the first optics layer 110, and the second optics layer 112) may be less than 2.0 mm (e.g., about 1.76 mm) by 3.0 mm (e.g., about 2.96 mm) and less than 3.0 mm (e.g., about 2.86 mm) in height (e.g., a dimension corresponding to the arrow labeled "Front").

As indicated above, FIG. 1 is provided as an example. Other examples may differ from what is described with regard to FIG. 1. The quantity and arrangement of components shown in FIG. 1 are provided as an example. In practice, there may be additional components, fewer components, different components, or differently arranged components than those shown in FIG. 1. Furthermore, two or more components shown in FIG. 1 may be implemented within a single component, or a single component shown in FIG. 1 may be implemented as multiple components. Additionally, or alternatively, a set of components (e.g., one or more components) shown in FIG. 1 may perform one or more functions described as being performed by another set of components shown in FIG. 1.

Figure 2:
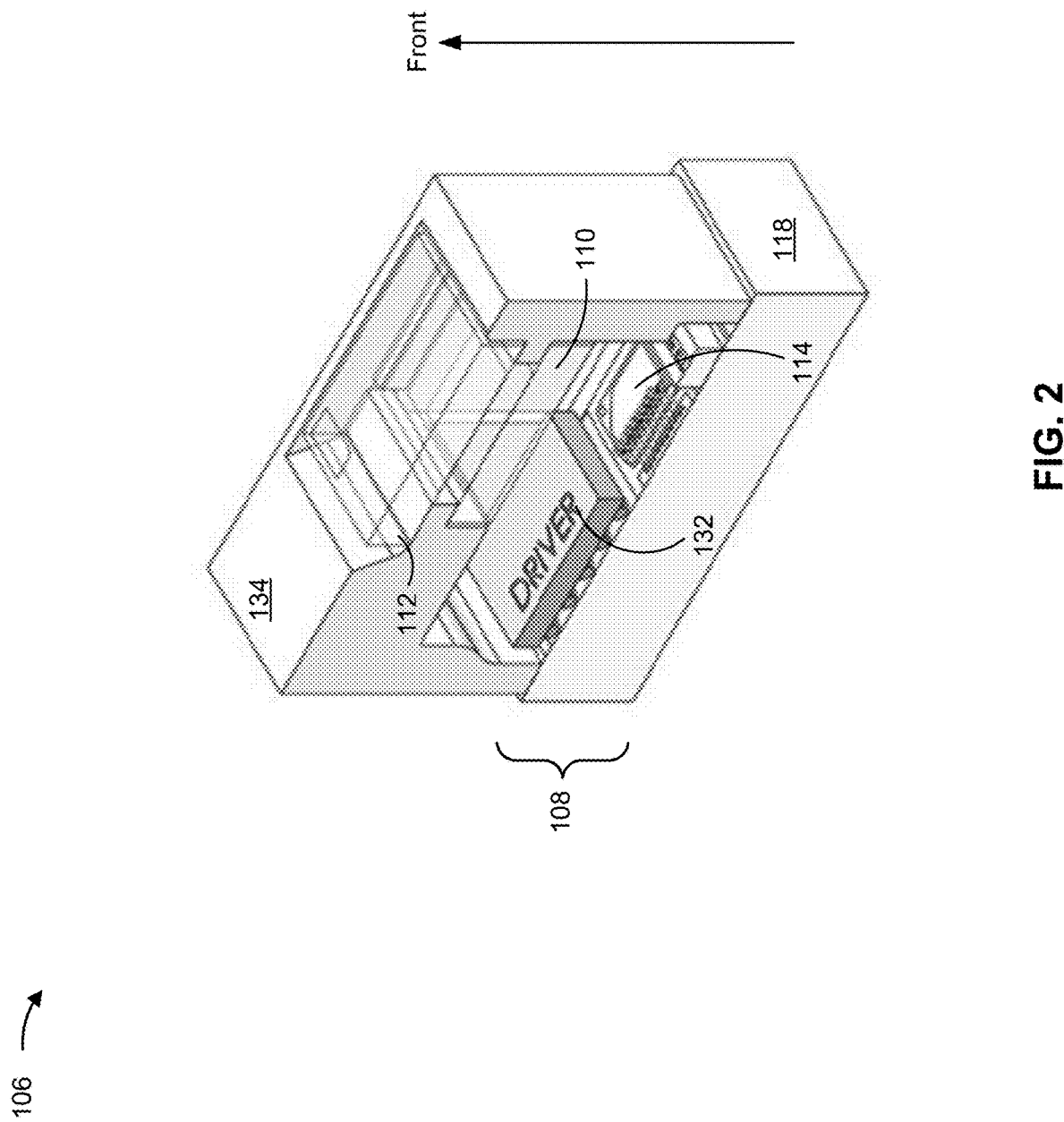
FIG. 2 is a diagram of a cutaway view of an example of an emitter module described herein.

FIG. 2 is a diagram of a cutaway view of an example of the emitter module 106 described herein. In the cutaway view of FIG. 2, a first lateral side of the emitter module 106 that includes the flood emitter array 114 and the optics for flood illumination is shown, while a second lateral side of the emitter module 106 that includes the spot emitter array 116 and the optics for spot illumination is not shown. As shown in FIG. 2, the emitter module 106 includes the emitter layer 108 (e.g., including the substrate 118), the first optics layer 110, and the second optics layer 112, as described above.

In some implementations, the emitter layer 108 may include a driver 132. That is, the driver 132 may be disposed on the substrate 118 of the emitter layer 108. The driver 132 may be configured to operate (e.g., direct electrical current to) the flood emitter array 114 and/or the spot emitter array 116. For example, the driver may be configured to operate the flood emitter array 114 in a flood illumination mode of the emitter module 106, operate the spot emitter array 116 in a spot illumination mode of the emitter module 106, and/or operate the flood emitter array 114 and the spot emitter array 116 in a combined flood illumination and spot illumination mode of the emitter module 106. In this way, the emitter module 106 may be used for range sensing applications in which a flood illumination pattern and a spot illumination pattern are projected simultaneously or sequentially.

In some implementations, the emitter module 106 may include a housing 134. The housing 134 may provide a structure that supports and/or contains one or more of the emitter layer 108, the first optics layer 110, or the second optics layer 112. For example, the substrate 118 may form a bottom side of the housing 134, such that the housing 134 contains the flood emitter array 114, the spot emitter array 116, and/or the driver 132. In addition, the housing 134 may include structures (e.g., slots or ledges, among other examples) that support the first optics layer 110 and the second optics layer 112. The housing 134 may be composed of a plastic and may be formed using a laser-direct structuring technique.

As indicated above, FIG. 2 is provided as an example. Other examples may differ from what is described with regard to FIG. 2.

Figure 3:
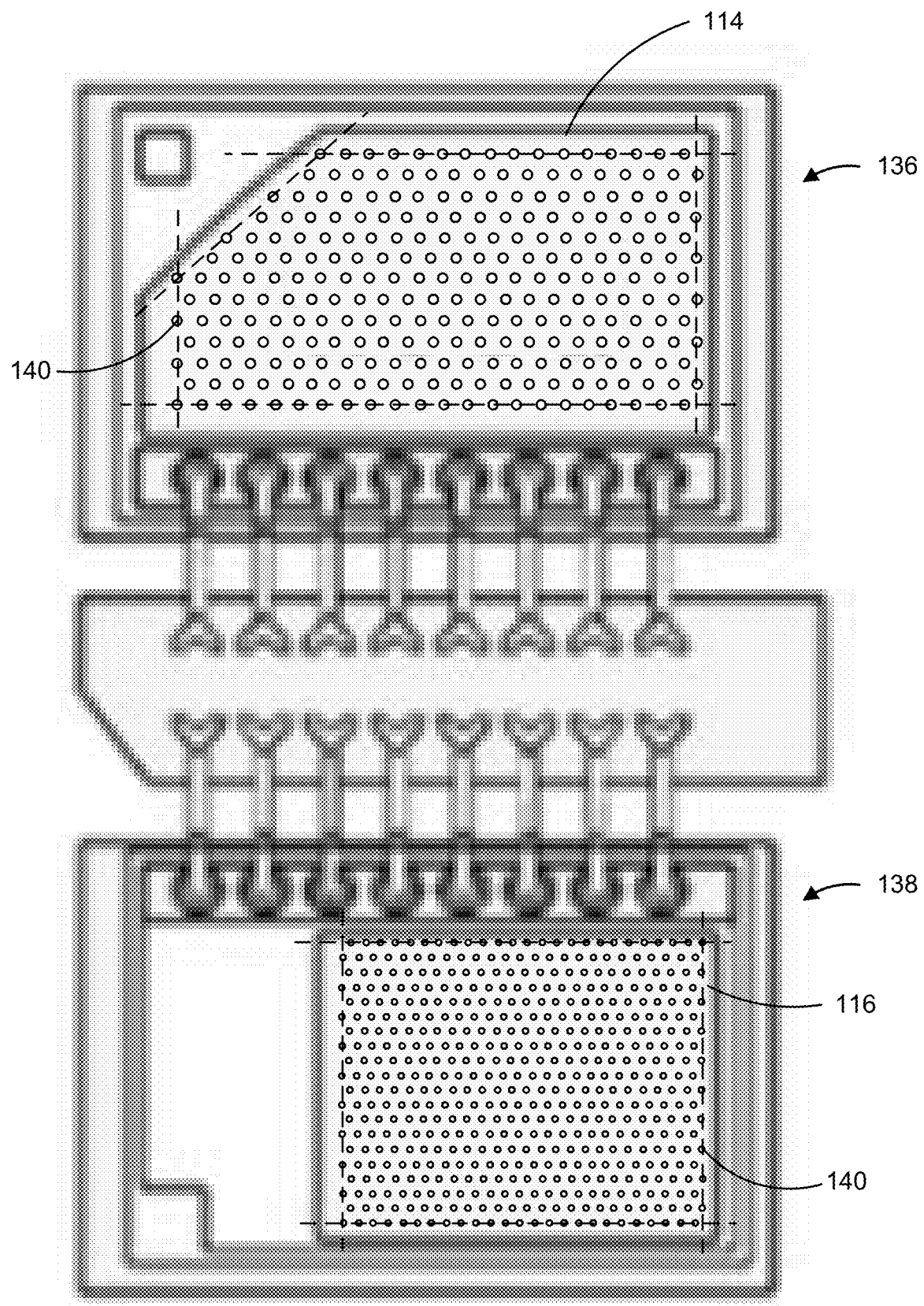
FIG. 3 is a diagram of an example of a flood emitter array and an example of a spot emitter array described herein.

FIG. 3 is a diagram of an example of the flood emitter array 114 and an example of the spot emitter array 116 described herein. As shown in FIG. 3, the flood emitter array 114 may be included in a first chip 136, and the spot emitter array 116 may be included in a second chip 138.

The flood emitter array 114 may include a first plurality of emitters 140 and the spot emitter array 116 may include a second plurality of emitters 140. In some implementations, a size (e.g., an area) and/or a shape of an emitter active area of the flood emitter array 114 and a size (e.g., an area) and/or a shape of an emitter active area of the spot emitter array 116 may be different. As shown in FIG. 3, an emitter active area of the flood emitter array 114 may be non-rectangular (e.g., a shape of the emitter active area of the flood emitter array 114 may be a trapezoid or an irregular pentagon). That is, the emitters 140 of the flood emitter array 114 may be arranged in a non-rectangular pattern (e.g., as shown in FIG. 3, at least two straight, intersecting lines passing through the outermost emitters 140 of the flood emitter array 114 may intersect at an oblique angle). In this way, an active area of the flood emitter array 114 may be maximized (e.g., a quantity of emitters 140 may be maximized), thereby maximizing an optical power of the flood emitter array 114, while maintaining a beam of the flood emitter array 114 within the aperture 104 (e.g., which is circular), as described below in connection with FIG. 4. As shown in FIG. 3, an emitter active area of the spot emitter array 116 may be rectangular. That is, the emitters 140 of the spot emitter array 116 may be arranged in a rectangular pattern (e.g., as shown in FIG. 3, any two straight, intersecting lines passing through the outermost emitters 140 of the spot emitter array 116 may intersect at a right angle).

As further shown in FIG. 3, respective lateral sides (e.g., shown in FIG. 3 as right-hand sides) of the flood emitter array 114 and the spot emitter array 116 may be laterally aligned. Thus, an optical center (and/or geometric center) of the flood emitter array 114 and an optical center (and/or geometric center) of the spot emitter array 116 may be laterally offset from each other (e.g., because the flood emitter array 114 and the spot emitter array 116 may be different shapes and/or sizes). Accordingly, respective optical centers of the flood collimating lens 120 and the spot collimating lens 122 may be laterally offset from each other (e.g., corresponding to the amount of lateral offset between the respective optical centers of the flood emitter array 114 and the spot emitter array 116).

As indicated above, FIG. 3 is provided as an example. Other examples may differ from what is described with regard to FIG. 3.

Figure 4:
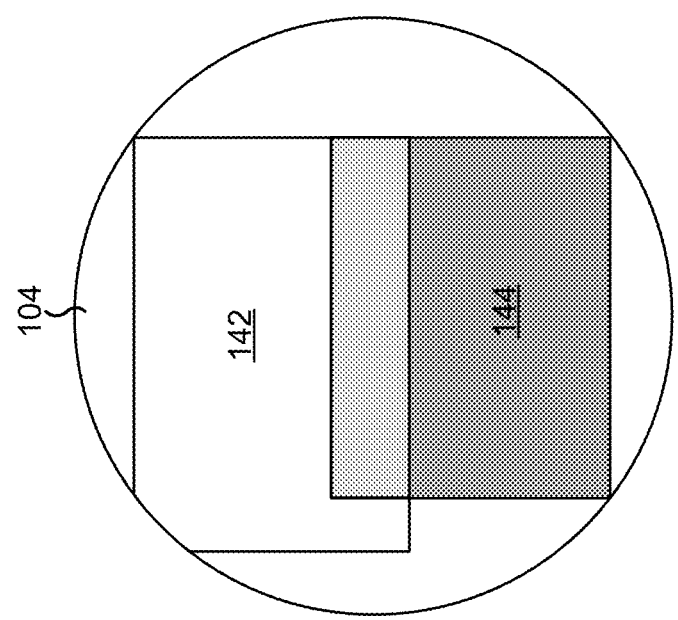
FIG. 4 is a diagram of an aperture of a sensing device with example beams described herein.

FIG. 4 is a diagram of the aperture 104 of the sensing device 100 with example beams 142, 144 described herein. The beam 142 represents a shape of a flood beam, produced by the flood emitter array 114, the flood collimating lens 120, and the optical diffuser 126, at the aperture 104 (e.g., at a distance of about 1 mm from the emitter module 106). As shown in FIG. 4, the non-rectangular emitter active area of the flood emitter array 114 produces a corresponding non-rectangular optical beam at the aperture 104 that provides additional coverage of the aperture 104 relative to a rectangular optical beam. The beam 144 represents a shape of a spot beam, produced by the spot emitter array 116, the spot collimating lens 122, and the beamsplitter grating 128, at the aperture 104 (e.g., at a distance of about 1 mm from the emitter module 106). As shown in FIG. 4, the rectangular emitter active area of the spot emitter array 116 produces a corresponding rectangular optical beam at the aperture 104.

The flood beam and the spot beam may overlap at the aperture 104, as shown. As further shown in FIG. 4, the flood beam and the spot beam, at the aperture 104, may have a combined size that is less than a size of the aperture 104. For example, a largest lateral dimension of the combined flood beam and spot beam, at the aperture 104, may be less than a diameter of the aperture 104. As another example, an area of the combined flood beam and spot beam, at the aperture 104, may be less than an area of the aperture 104. In some implementations, a combined size of the flood beam and the spot beam at the aperture 104 (e.g., at about a 1.0 mm distance in front of the second optics layer 112) is less than a sum of the respective sizes of the flood beam and the spot beam at the aperture 104. That is, the flood beam and the spot beam may overlap at the aperture, such that the combined size (e.g., the overlapped size) of the flood beam and the spot beam is less than a sum of the individual sizes of the flood beam and the spot beam. In some implementations, the flood beam and the spot beam have a combined size that is less than or equal to about 6.0 mm across, 5.5 mm across, 5.0 mm across, 4.5 mm across, or 4.0 mm across, at the aperture 104 (e.g., at about a 1.0 mm distance in front of the second optics layer 112).

This compact combined beam size is attributable to the use of the flood collimating lens 120 between the flood emitter array 114 and the optical diffuser 126. Furthermore, use of the flood collimating lens 120 may produce a band-limited, or sharp far-field (e.g., at about 500 mm from the aperture 104), flood illumination pattern relative to the use of the flood emitter array 114 and the optical diffuser 126 without the flood collimating lens 120.

As indicated above, FIG. 4 is provided as an example. Other examples may differ from what is described with regard to FIG. 4.

Figure 5:
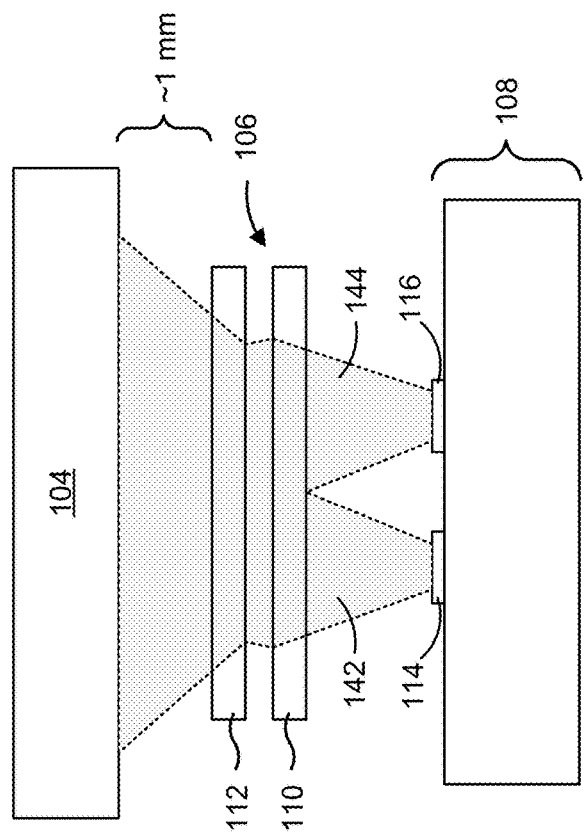
FIG. 5 is a diagram of a cross-sectional view of an example sensing device with example beams described herein.

FIG. 5 is a diagram of a cross-sectional view of the example sensing device 100 with the example beams 142, 144 described herein. In particular, FIG. 5 shows a propagation of the beams 142, 144 at the emitter layer 108, the first optics layer 110, the second optics layer 112, and the aperture 104. At a surface of the first optics layer 110 (e.g., a surface where the beams 142, 144 enter the first optics layer 110), the beams 142, 144 may not overlap (e.g., in a direction transverse to the emission direction of the emitter module 106), for example, to avoid interference. At a surface of the second optics layer 112 (e.g., a surface where the beams 142, 144 enter the second optics layer 112), the beams 142, 144 may not overlap (e.g., in a direction transverse to the emission direction of the emitter module 106), for example, to avoid interference. The collimating lenses of the first optics layer may reduce respective sizes of the beams 142, 144 at the second optics layer 112, such that there is no overlap of the beams 142, 144 at the second optics layer 112. Thus, the flood emitter array 114 and the spot emitter array 116 may be located in close proximity to facilitate miniaturization of the emitter module 106. At a surface of the aperture 104 (e.g., a surface where the beams 142, 144 enter the aperture 104), the beams 142, 144 may overlap (e.g., in a direction transverse to the emission direction of the emitter module 106), as described above in connection with FIG. 4. For example, the beams 142, 144 may overlap so as to reduce the combined beam size of the beams 142, 144 at the aperture 104.

As indicated above, FIG. 5 is provided as an example. Other examples may differ from what is described with regard to FIG. 5.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical cavity surface emitting laser (VCSEL) module, comprising:
  a VCSEL layer, comprising:
    a substrate,
    a first VCSEL array disposed on the substrate and configured to produce a first beam that provides illumination for a first sensor having a first sensing distance, and
    a second VCSEL array disposed on the substrate and configured to produce a second beam that provides illumination for a second sensor having a second sensing distance that is greater than the first sensing distance;
  a first optics layer, positioned in front of the VCSEL layer, comprising:
    a first collimating lens positioned in front of the first VCSEL array, and
    a second collimating lens positioned in front of the second VCSEL array; and
  a second optics layer, positioned in front of the first optics layer, comprising:
    an optical diffuser positioned in front of the first collimating lens, and
    a diffractive optical element positioned in front of the second collimating lens,
    wherein the first beam and the second beam are to overlap at an aperture that is less than or equal to 1 millimeter distance in front of the second optics layer, such that the first beam and the second beam have a combined beam size that is less than a size of the aperture.

2. The VCSEL module of claim 1, wherein VCSELs of the first VCSEL array are arranged in a non-rectangular pattern.

3. The VCSEL module of claim 1, wherein the first collimating lens is associated with a longer effective focal length than the second collimating lens.

4. The VCSEL module of claim 1, wherein an f-number associated with the first collimating lens and the second collimating lens is from 0.9 to 2.

5. The VCSEL module of claim 1, wherein the combined size of the first beam and the second beam is less than or equal to 4.5 millimeters across at the aperture.

6. The VCSEL module of claim 1, wherein the first optics layer and the second optics layer are separated by a medium with a refractive index from 1.4 to 1.6.

7. The VCSEL module of claim 1, wherein the first collimating lens and the second collimating lens each comprise one or more diffractive surfaces or a Fresnel lens.

8. The VCSEL module of claim 1, wherein the first collimating lens and the second collimating lens each comprise one or more refractive surfaces.

9. The VCSEL module of claim 1, wherein the optical diffuser comprises a refractive diffuser or a diffractive diffuser and the diffractive optical element comprises a fan-out diffractive optical element.

10. An emitter module, comprising:
  an emitter layer, comprising:
    a first emitter array configured to produce a first beam that provides illumination for a first sensor having a first sensing distance, and
    a second emitter array configured to produce a second beam that provides illumination for a second sensor having a second sensing distance that is greater than the first sensing distance;
  a first optics layer, positioned in front of the emitter layer, comprising:
    a first collimating lens positioned in front of the first emitter array, and
    a second collimating lens positioned in front of the second emitter array; and
  a second optics layer, positioned in front of the first optics layer, comprising:
    an optical diffuser positioned in front of the first collimating lens, and
    a diffractive optical element positioned in front of the second collimating lens,
    wherein the first beam and the second beam are to overlap at an aperture that is less than or equal to 1 millimeter distance in front of the second optics layer, such that the first beam and the second beam have a combined beam size that is less than a size of the aperture.

11. The emitter module of claim 10, wherein the combined size of the first beam and the second beam is less than or equal to 4.5 millimeters across at the aperture.

12. The emitter module of claim 10, wherein a first distance between the first emitter array and the first optics layer is less than a second distance between the second emitter array and the first optics layer.

13. The emitter module of claim 10, wherein the first optics layer further comprises a substrate, and
  wherein the first collimating lens and the second collimating lens are disposed on the substrate.

14. The emitter module of claim 10, wherein the first collimating lens is a first segment of the first optics layer and the second collimating lens is a second segment of the first optics layer, and
  wherein the first segment and the second segment are adjoined.

15. The emitter module of claim 10, wherein the second optics layer further comprises a substrate, and
  wherein the optical diffuser and the diffractive optical element are disposed on the substrate.

16. The emitter module of claim 10, wherein the optical diffuser is a first segment of the second optics layer and the diffractive optical element is a second segment of the second optics layer, and
  wherein the first segment and the second segment are adjoined.

17. A sensing device, comprising:
  a housing;
  an aperture in the housing; and
  an emitter module within the housing, comprising:
    an emitter layer, comprising:
      a first emitter array configured to produce a first beam that provides illumination for a first sensor having a first sensing distance, and
      a second emitter array configured to produce a second beam that provides illumination for a second sensor having a second sensing distance that is greater than the first sensing distance;
    a first optics layer, positioned in front of the emitter layer, comprising:

a first collimating lens positioned in front of the first emitter array, and a second collimating lens positioned in front of the second emitter array; and a second optics layer, positioned in front of the first optics layer, comprising:

an optical diffuser positioned in front of the first collimating lens, and a diffractive optical element positioned in front of the second collimating lens, wherein the first beam and the second beam are to overlap at the aperture, such that the first beam and the second beam have a combined beam size that is less than a size of the aperture, and wherein the aperture is less than or equal to 1 millimeter distance in front of the second optics layer.

18. The sensing device of claim 17, wherein the aperture is less than or equal to 4.5 millimeters in diameter.

19. The sensing device of claim 17, wherein the emitter layer and the first optics layer are separated by a distance from 0.2 millimeters to 2 millimeters, and wherein the first optics layer and the second optics layer are separated by a distance from 0.01 millimeters to 0.5 millimeters.

20. The sensing device of claim 17, wherein a center of the first emitter array and a center of the second emitter array are separated by a distance from 1.3 millimeters to 1.4 millimeters.

* * * * *